(12) United States Patent
Stauff et al.

(10) Patent No.: US 10,512,177 B2
(45) Date of Patent: Dec. 17, 2019

(54) HOUSING TO CLAD ELECTRICAL COMPONENTS OF A MOTOR VEHICLE

(71) Applicant: FORD GLOBAL TECHNOLOGIES, LLC, Dearborn, MI (US)

(72) Inventors: Sebastian Stauff, Cologne (DE); Sascha Haase, Wermelskirchen (DE)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/024,575

(22) Filed: Jun. 29, 2018

(65) Prior Publication Data

US 2019/0029128 A1  Jan. 24, 2019

(30) Foreign Application Priority Data

Jul. 21, 2017  (DE) ........................ 10 2017 212 610

(51) Int. Cl.
| | |
|---|---|
| H05K 7/02 | (2006.01) |
| H05K 7/04 | (2006.01) |
| H05K 5/00 | (2006.01) |
| B60R 16/023 | (2006.01) |
| B29C 45/14 | (2006.01) |
| B60R 16/02 | (2006.01) |
| B60R 16/03 | (2006.01) |
| H05K 5/02 | (2006.01) |
| B29K 101/12 | (2006.01) |
| B29L 31/34 | (2006.01) |

(52) U.S. Cl.
CPC ..... *H05K 5/0017* (2013.01); *B29C 45/14639* (2013.01); *B29C 45/14819* (2013.01); *B60R 16/0207* (2013.01); *B60R 16/0239* (2013.01); *B60R 16/03* (2013.01); *H05K 5/0004* (2013.01); *H05K 5/0247* (2013.01); *B29K 2101/12* (2013.01); *B29L 2031/3481* (2013.01)

(58) Field of Classification Search
USPC ........................................................ 361/809
See application file for complete search history.

(56) References Cited

U.S. PATENT DOCUMENTS 5,455,716 A * 10/1995 Suman ..................... B60R 1/04
                                                                  248/479
6,190,209 B1   2/2001 Huelsmann et al.
(Continued)

FOREIGN PATENT DOCUMENTS

| DE | 10261771 A1 | 7/2003 |
|---|---|---|
| DE | 202006020938 U1 | 1/2011 |
| WO | 2015136448 A1 | 9/2015 |

*Primary Examiner* — Hung S. Bui
(74) *Attorney, Agent, or Firm* — Brooks Kushman P.C.; Frank Lollo

(57) ABSTRACT

A housing that accommodates and clads electrical components includes a first housing part with a contact area that bears against a windshield of a motor vehicle. A second housing part, which is connected to the first housing part to form a cavity, where the electrical or electronic components are arranged in the cavity. The first or the second housing part has a number of conductor tracks that are conductively connected to the electrical components. In addition, the disclosure relates to a motor vehicle having a housing of this kind and an on-board electronics system, wherein at least some of the conductor tracks are connected to the on-board electronics system.

17 Claims, 2 Drawing Sheets

(56) References Cited

U.S. PATENT DOCUMENTS

| | | | | |
|---|---|---|---|---|
| 6,326,613 | B1* | 12/2001 | Heslin | B60R 1/04 |
| | | | | 250/214 AL |
| 6,521,830 | B1* | 2/2003 | Platz | B29C 70/72 |
| | | | | 174/50 |
| 6,824,281 | B2* | 11/2004 | Schofield | B60R 1/04 |
| | | | | 359/876 |
| 7,002,524 | B1 | 2/2006 | Branham | |
| 7,049,982 | B2* | 5/2006 | Sleboda | G01C 21/26 |
| | | | | 340/539.1 |
| 8,531,279 | B2* | 9/2013 | DeLine | B60R 1/12 |
| | | | | 340/425.5 |
| 9,131,636 | B2 | 9/2015 | Konchan | |
| 2007/0089444 | A1* | 4/2007 | Chen | B60H 1/00264 |
| | | | | 62/235.1 |
| 2009/0314556 | A1* | 12/2009 | Harris | B60K 16/00 |
| | | | | 180/65.1 |
| 2014/0140021 | A1 | 5/2014 | Malek et al. | |
| 2015/0382462 | A1 | 12/2015 | Koch et al. | |

* cited by examiner

HOUSING TO CLAD ELECTRICAL COMPONENTS OF A MOTOR VEHICLE

CROSS-REFERENCE TO RELATED APPLICATIONS

This application claims foreign priority benefits under 35 U.S.C. § 119(a)-(d) to DE Application 10 2017 212 610.8 filed Jul. 21, 2017, which is hereby incorporated by reference in its entirety.

TECHNICAL FIELD

The present disclosure relates to a housing to accommodate and clad electrical and/or electronic components of a motor vehicle.

BACKGROUND

A number of electrical and/or electronic components in motor vehicles is continuously increasing. This trend is due to attempts, firstly, to improve comfort for occupants of the motor vehicle, and, secondly, to improve safety during operation of the motor vehicle. Particularly for the purpose of increasing safety, ever more complex assistance systems are used. These assistance systems assist a driver of the motor vehicle and intervene in dangerous situations in order to prevent accidents. In principle, the assistance systems are also able to control the motor vehicle completely and without intervention by the driver, so that autonomous driving is possible.

As the number of electrical or electronic components increases, more installation space is accordingly required, but installation space is very scarce in a motor vehicle. Attempts are therefore made to also accommodate at least some of the electrical and/or electronic components in locations where they have not been arranged or have been arranged only in specific cases to date. Increasingly, a windshield is at least sometimes used to arrange the electrical and/or electronic components in the vehicle. Up until recently, only an interior rearview mirror was fastened, for example via a suction cup, to that side of the windshield that faces an interior compartment of the motor vehicle. However, the interior rearview mirror had no functions that would make cabling of the interior rearview mirror to the on-board electronics system of the motor vehicle necessary. However, modern interior rearview mirrors have electrical and/or electronic functions. Electronically dimmable mirrors exist for example.

For example, it is known in a case of taxis that a current price of the taxi journey is displayed in the interior rearview mirror. Furthermore, the interior rearview mirror can be connected to a reversing camera of the motor vehicle, as a result of which a separate display in the dashboard of the motor vehicle can be dispensed. The reversing camera is usually activated and its image signals displayed only during reversing. However, it is also feasible to display the image signals from the reversing camera permanently in the interior rearview mirror. In this way, the traffic situation behind the motor vehicle in question can also be observed by the driver when the motor vehicle in question is heavily loaded and therefore the view through the rear windshield is obscured. A measure of this kind is also suitable for transporters that do not have a rear windshield and therefore there is no option of observing the traffic situation behind the motor vehicle in question via the interior rearview mirror.

Further electrical and/or electronic components that can be arranged in a region of the windshield are rain sensors and cameras, where the cameras serve, in particular, to identify road signs, as a result of which, for example, a speed of the vehicle can be accordingly adjusted.

In order to be able to arrange the electrical and/or electronic components in the region of the windshield, housings that usually have at least two housing parts are used. A housing of this kind is known from DE 20 2006 020 938 U1. A first housing part has a fastening area that the housing part in question bears against that side of the windshield that faces the interior compartment of the motor vehicle and can be connected thereto, for example by adhesive bonding. The other housing part is mounted, for example, onto the first housing part and fastened by means of a latching connection. In the process, the first and the second housing part surround a cavity in which the electrical and/or electronic components can be arranged. If one or more of the components has to optically interact with the surrounding area, as is the case in rain sensors and cameras for example, the housing part which bears against the windshield can have a corresponding cutout.

The electrical and/or electronic components have to be conductively connected to the on-board electronics system of the motor vehicle in order to be supplied with electrical energy and/or to be able to interchange signals with the on-board electronics system. To this end, the electrical and/or electronic components are connected to the on-board electronics system by way of corresponding electrical cables and also plugs and corresponding sockets.

Attempts are made to design the housing, in which the electrical and/or electronic components are arranged in the region of the windshield, to be as small as possible. One reason for this, amongst others, is that the view through the windshield, in particular for the driver, should be impaired as little as possible. In addition, the design of the interior compartment of the motor vehicle should be determined by the housing as little as possible. Consequently, the cavity available for this purpose should be of very narrow dimensions, as a result of which assembly and, in particular, cabling is relatively complicated and manufacture is made more expensive.

SUMMARY

The object of one embodiment of the disclosure is to specify a housing, which is simple to fit and, in the process, requires only little installation space.

One embodiment of the disclosure relates to a housing that accommodates and clads electrical or electronic components of a motor vehicle, comprising a first housing part with a contact area that the housing can be placed or bears against a windshield of the motor vehicle, a second housing part that can be connected or is connected to the first housing part so as to form a cavity, where the electrical or electronic components can be arranged or are arranged in the cavity, where the first and/or the second housing part have/has a number of conductor tracks that the electrical or electronic components, which are arranged in the cavity, can be conductively connected or are conductively connected.

The first housing part can be fastened to the windshield, for example by adhesive bonding. However, the first housing part can also be part of a roof structure that extends over that side of the windshield that faces an interior compartment of the motor vehicle. In this case, the first housing part can bear only against the windshield, without having to be fastened to it.

The conductor tracks can be adhesively bonded, for example, in the housing parts before the housing parts are fitted in the motor vehicle. Latching connections are likewise feasible. Furthermore, the conductor tracks can be provided with plug-in openings into which the electrical and/or electronic components only have to be inserted, without further fastening measures being required. The use of plug-in connections with plugs and sockets to connect cables is no longer necessary. Consequently, the plugs also no longer have to be inserted into the sockets during assembly, simplifying the assembly. The plug-in connection between the plugs and the sockets can come loose as a result of action of vibrations that occur during operation of the vehicle, the action of vibrations being precluded by the proposed embodiment of the housing. In addition, the plug-in connections can cause noise on account of the vibrations, said noise being avoided by the use of the proposed conductor tracks.

Conductor tracks can be configured to be considerably flatter than cables, plugs and sockets, as a result of which installation space can be saved and the housing can be configured to be flatter overall, without making assembly more difficult. In addition, a number of components that are arranged in the housing can be increased, freeing up installation space in other regions of the motor vehicle.

According to a further embodiment, at least some of the conductor tracks can be connected to an on-board electronics system. In this case, the electrical or electronic components that are connected to the conductor tracks can be connected to the on-board electronics system, so that the components can be supplied with electrical energy and interchange signals with the on-board electronics system. However, it is not necessary to configure all conductor tracks such that the conductor tracks can be connected to the on-board electronics system. For example, a solar module or a solar cell that is connected to a conductor track can be arranged in the housing. This conductor track can, in turn, be conductively connected to a USB connection to which a smartphone or tablet can be connected, and, by way of which USB connection, said smartphone or tablet can be charged.

In a developed embodiment, the first and/or the second housing part can be produced from an injection-moldable material and the conductor tracks can be at least partially encapsulated by injection molding. Thermoplastics are suitable injection-moldable materials. In this embodiment, the housing parts can be provided with the conductor tracks during production, so that no additional manufacturing step is required. Therefore, a provision of this embodiment of the proposed housing is very cost-effective.

In the case of a developed embodiment, the electrical or electronic components can comprise an electronic interior rearview mirror, a light sensor, a rain sensor, a moisture sensor, a camera, a charger and/or a heating apparatus. An electronic interior rearview mirror is intended to be understood to mean an interior rearview mirror that has electronic functions. As mentioned at the outset, electronic interior rearview mirrors can be connected to a reversing camera of the motor vehicle and serve as a display to display image signals, which are generated by the reversing camera. A light sensor can be used, for example, for open- or closed-loop control of an interior lighting arrangement and headlamps of the motor vehicle. A rain sensor can be used to actuate windshield wipers of the motor vehicle and/or reduce a speed of the motor vehicle in heavy rain in order to avoid aquaplaning. Cameras can be used to identify road signs. Chargers, which comprise a solar module or a solar cell for example, can be used to supply electrical energy, in particular, to other components that are arranged in the housing. Heating apparatuses can be used to heat the windshield in order to prevent said windshield fogging up for example.

One refinement of the disclosure relates to a motor vehicle having a housing according to one of the previous embodiments, a windshield and an on-board electronics system, where the housing is arranged in the region of the windshield and at least some of the conductor tracks are connected to the on-board electronics system. The technical effects and advantages that can be achieved with the proposed motor vehicle correspond to those that have been discussed for the present housing. In summary, it should be noted that assembly of the housing can be simplified by using conductor tracks. Since the installation space that is required can be reduced in comparison to a cabling arrangement comprising cables and plug-in connections, a size of the housing can also be reduced. The view, in particular for the driver, through the windshield is impaired to a lesser extent, and the influence of the housing on the configuration and design of the interior compartment is reduced. The number of components in the housing can be increased, so that this frees up installation space in other regions of the motor vehicle. As already mentioned, the housing is arranged in the region of the windshield and can be part of a roof structure. It is possible for components of a sliding roof to be arranged in the housing, this being advantageous particularly when the sliding roof is configured as a panoramic roof. In this case, the panoramic roof can be guided further to the windshield, so that the panoramic roof comprises a larger area of the vehicle roof than has been possible to date.

One implementation of the disclosure relates to a method that produces a housing that accommodates electrical or electronic components of a motor vehicle according to one of the preceding embodiments, comprising the following steps:

providing a first housing part and/or second housing part by injection molding, and encapsulating conductor tracks during the injection molding operation.

The housing parts can be provided with the conductor tracks during production, so that no additional manufacturing step is required. To this end, the housing parts are manufactured from an injection-moldable material, for example thermoplastic. Therefore, the provision of this embodiment of the proposed housing is very cost-effective. The second housing part can be produced in the same way, with or without the conductor tracks.

Exemplary embodiments of the disclosure will be explained in greater detail below with reference to the appended drawings, in which

DETAILED DESCRIPTION

As required, detailed embodiments of the present disclosure are disclosed herein; however, it is to be understood that the disclosed embodiments are merely exemplary of the disclosure that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present disclosure.

Figure 1:
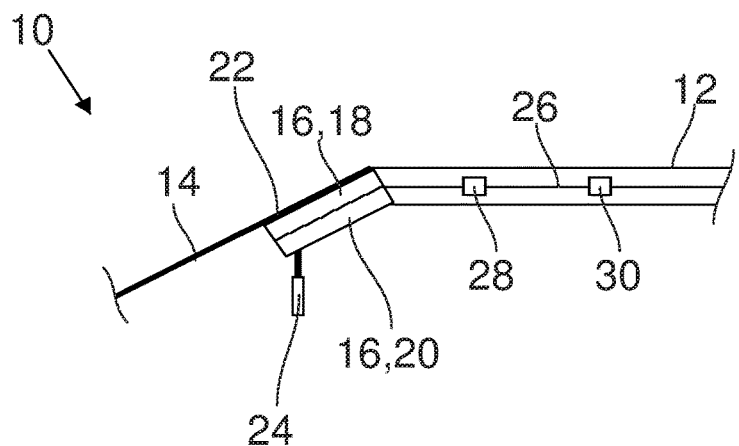
FIG. 1 shows a basic illustration of a motor vehicle in a region of transition from a vehicle roof to a windshield having a housing that accommodates and clads electrical or electronic components.

FIG. 1 shows a basic illustration of a section of a motor vehicle 10. The motor vehicle 10 has a vehicle roof 12 that is connected to a windshield 14. A housing 16, which has a first housing part 18 and a second housing part 20 that together surround a cavity 21 (see FIGS. 2 and 3), is fastened to the windshield 14. The first housing part 18 can be connected to the second housing part 20 by a latching connection for example. Other types of connection such as adhesive bonding or welding are likewise feasible. The first housing part 18 has a contact area 22 by way of which the first housing portion 18 bears against the windshield 14. The contact area 22 can be used to fasten the housing 16 to the windshield 14, for example using an adhesive. However, it is likewise possible to use other fastening means, such as suction cups or screw connections. In addition, an interior rearview mirror 24 is connected to the housing 16.

A portion of a schematically illustrated on-board electronics system 26 is arranged in the vehicle roof 12, said portion extending not only over the vehicle roof 12 but rather also over other regions, not illustrated, of the motor vehicle 10. The on-board electronics system 26 can have, for example, an energy source 28 and a control unit 30.

Figure 2:
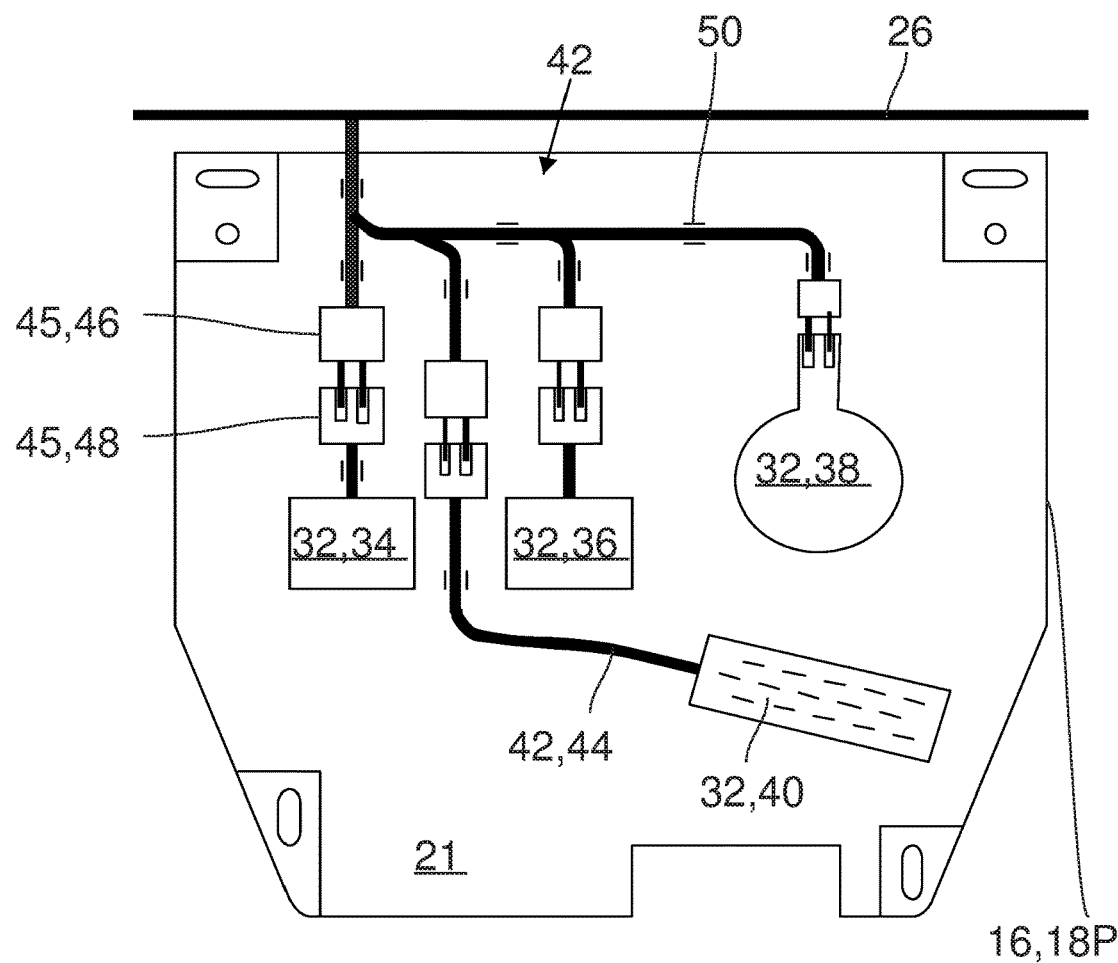
FIG. 2 shows a basic plan view of a housing part of a housing that accommodates and clads electrical or electronic components according to the prior art.

FIG. 2 illustrates the first housing part 18P by way of a basic plan view, as is known from the prior art. In principle, the second housing part 20, not illustrated here, can be constructed in exactly the same way. It is clear that various electrical or electronic components 32 are arranged in the first housing half, for example a rain sensor 34, a light sensor 36, a camera 38 and a heating apparatus 40.

All of the components 32 are connected to the on-board electronics system 26 by a cabling arrangement 42 in order to be supplied with electrical energy and/or interchange signals with the on-board electronics system 26. The interior rearview mirror 24 can also be connected to the on-board electronics system 26 by the cabling arrangement 42 (not illustrated). The cabling arrangement 42 comprises electrically conductive cables 44 and also plug-in connections 45 that comprise plugs 46 and corresponding sockets 48. It is clear that the plug-in connections 45 take up a relatively large amount of space.

Furthermore, clips 50 into which the cables 44 can be pressed in order to fasten and guide the cables 44 within the housing 16 are provided. The clips 50 have the effect that the cables 44 do not begin to move in an uncontrolled manner owing to the effect of shaking phenomena, which are created during operation of the motor vehicle 10. This prevents the plug-in connections 45 becoming loose owing to the effect of the shaking phenomena and vibrations. In addition, the cables 44 are prevented from possibly becoming kinked and, as a result, damaged or even severed.

In order to prevent damage or severing of the cables 44, said cables may be bent only by a relatively large radius. As a result, the components 32 cannot be arranged in any desired manner within the first housing part 18P and, respectively, the housing 16. Certain regions of the first housing part 18P cannot be utilized with use of the cabling arrangement 42 shown in FIG. 2, as a result of which the available installation space can be utilized only to an insufficient extent.

Figure 3:
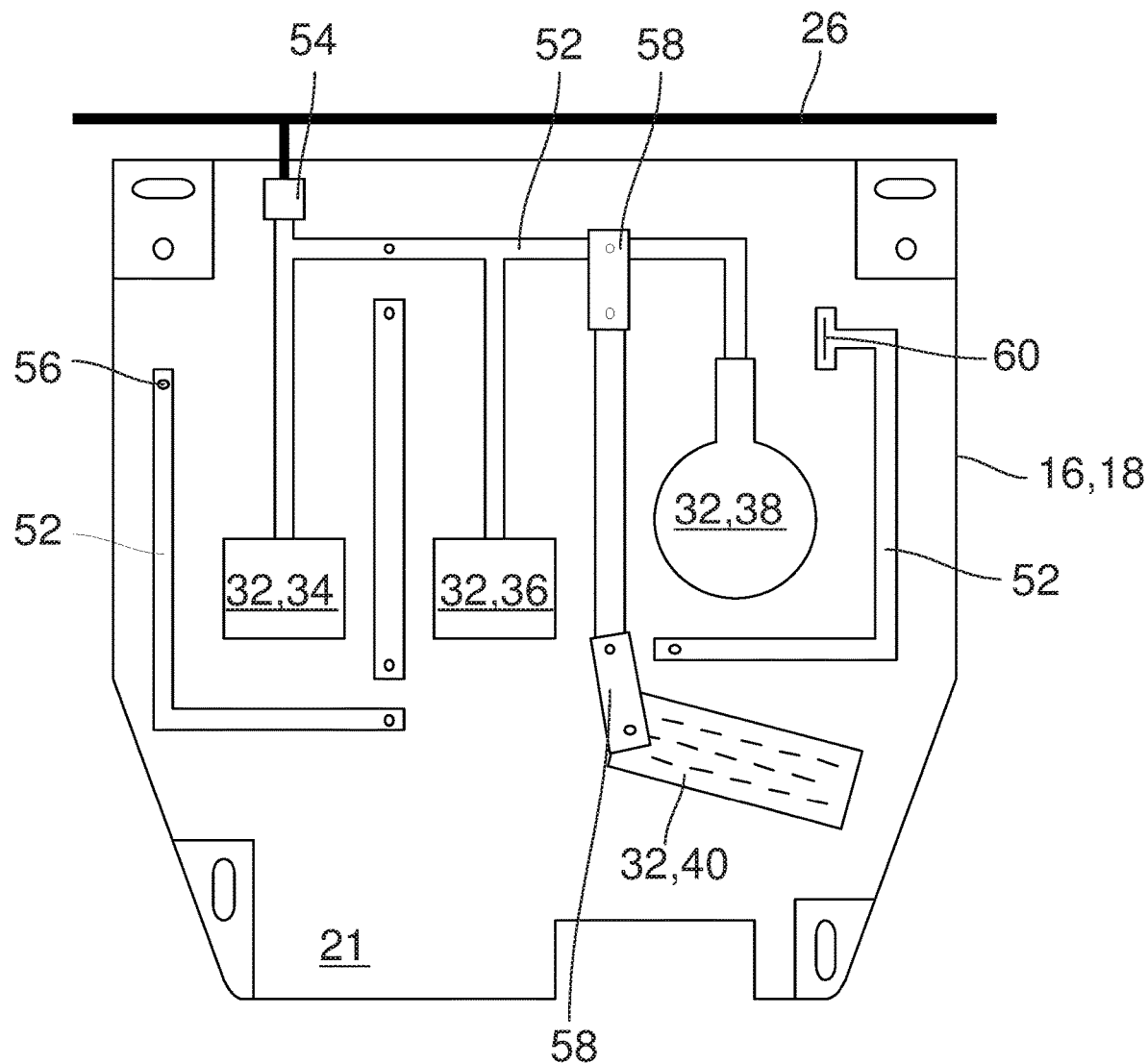
FIG. 3 shows a basic plan view of a housing part of a housing according to the disclosure that accommodates or clads electrical or electronic components.

FIG. 3 shows an exemplary embodiment of a first housing part 18 according to the disclosure. This differs substantially from the first housing part 18P shown in FIG. 2 and known from the prior art in that, instead of the cabling arrangement 42, which comprises the cables 44 and plug-in connections 45, conductor tracks 52 are used in order to provide a conductive connection between the components 32 that are arranged in the housing 16 and/or to the on-board electronics system 26 of the motor vehicle 10. The conductor tracks 52 can be composed of an electrically conductive material such as copper and configured to be very flat, so that they require considerably less space than the cabling arrangement 42 shown in FIG. 2 and, in particular, the plug-in connections 45.

In contrast to the cables 44, the conductor tracks 52 can be laid in virtually any desired manner within the first housing part 18. In particular, the conductor tracks 52 can have sections that run at an acute angle in relation to one another. Therefore, virtually any region of the first housing part 18 can be provided with conductor tracks 52. The number of components 32 that are arranged in the housing 16 can be considerably increased in comparison to the prior art housing shown in FIG. 2, or the housing 16 can be of smaller construction.

The two housing parts 18, 20 can be produced from an injection-moldable material, for example a thermoplastic. The conductor tracks 52 can be encapsulated during the injection-molding operation.

Some of the conductor tracks 52 are connected to the on-board electronics system 26 by a correspondingly configured connection 54. The conductor tracks 52 have, in particular at their respective ends, plug-in openings 56 into which the electrical or electronic components 32 can be inserted. The plug-in openings 56 can be configured such that they simultaneously also ensure fastening of the components 32 in question within the first housing part 18, so that no further fastening measures are required. In addition, it is not necessary to connect all of the conductor tracks 52 to the on-board electronics system 26. Rather, the various conductor tracks 52 can be connected to one another selectively by bridges 58. A connection to the on-board electronics system 26 can be established as a result. However, it is likewise easily possible to deliberately not connect some of the conductor tracks 52 to the on-board electronics system 26. For example, one of the components 32 can be configured as a charger (not illustrated), which comprises a solar module or a solar cell. The electrical energy that is provided in this way can be transmitted, for example, to a smartphone or a tablet by means of a USB connection 60. It goes without saying that the components 32, which are arranged within the housing 16, can also be supplied with electrical energy in this way, as a result of which the energy required by the on-board electronics system 26 can be reduced. It is likewise feasible to feed the electrical energy that is provided in this way into the on-board electronics system 26. It is also possible here for the second housing part 20 to be constructed in exactly the same way as the first housing part 18. However, the second housing part 20 can also serve only as a cover and not have any conductor tracks 52.

While exemplary embodiments are described above, it is not intended that these embodiments describe all possible forms of the disclosure. Rather, the words used in the specification are words of description rather than limitation, and it is understood that various changes may be made without departing from the spirit and scope of the disclosure. Additionally, the features of various implementing embodiments may be combined to form further embodiments of the disclosure.

What is claimed is:

1. A housing to clad electrical components of a vehicle comprising:
    a first housing part having a first central region with a contact area that bears the housing against a windshield, the first housing part having a first edge region peripherally extending about the first central region; and
    a second housing part having a second central region and a second edge region extending peripherally about the second central region, the second edge region of the second housing part connected to the first edge region of the first housing part to form a cavity between the first and second central regions, wherein the electrical components are arranged in the cavity,
    wherein the first and the second central regions of the first and second housing parts each have conductor tracks to which the electrical components are arranged in the cavity and conductively connected; and
    wherein the first and the second housing parts are produced from an injection-moldable material and the conductor tracks are at least partially encapsulated by injection molding.

2. The housing as claimed in claim 1, wherein at least some of the conductor tracks are connected to an on-board electronics system.

3. The housing as claimed in claim 1, wherein the electrical components comprise an electronic interior rearview mirror, a light sensor, a rain sensor, a moisture sensor, a camera, a charger or a heating apparatus.

4. A motor vehicle comprising:
    a first housing part having a first central region with a contact area that bears the first housing part against a windshield, the first housing part having a first edge region peripherally extending about the first central region;
    a second housing part having a second central region and a second edge region extending peripherally about the second central region, the second edge region of the second housing part connected to the first edge region of the first housing part to form a cavity between the first and second central regions, wherein the first and second central regions of the first and the second housing parts each have conductor tracks that conductively connect electrical components arranged in the cavity; and
    an on-board electronics system, wherein at least some of the conductor tracks are connected to the on-board electronics system to interconnect the electrical components and the on-board electronics system;
    wherein the first and the second housing parts are produced from an injection-moldable material and the conductor tracks are at least partially encapsulated by injection molding.

5. The motor vehicle as claimed in claim 4, wherein the electrical components include an electronic interior rearview mirror, a light sensor, a rain sensor, a moisture sensor, a camera, a charger or a heating apparatus.

6. The motor vehicle as claimed in claim 4, wherein the on-board electronics system includes a control unit that is configured to control the electrical components via signal interchange.

7. The motor vehicle as claimed in claim 4 further comprising a windshield, wherein the contact area of the first housing is directly connected to the windshield.

8. The motor vehicle as claimed in claim 4 further comprising a roof structure, the roof structure defining the first housing part such that the first housing part extends over the windshield without being fastened to the windshield.

9. The motor vehicle as claimed in claim 4 further comprising an interior rearview mirror supported by at least one of the first and second housing parts.

10. The motor vehicle as claimed in claim 4, wherein the conductor tracks are at least partially encapsulated by one of the first and second housing parts.

11. The motor vehicle as claimed in claim 4, wherein the conductor tracks include a first linear section directly connected to a second linear section at an acute angle thereto.

12. The motor vehicle as claimed in claim 4, wherein the conductor tracks include a first linear section and a second linear section; and
    wherein the motor vehicle further comprises a bridge directly connecting the first section to the second section.

13. The motor vehicle as claimed in claim 4, wherein at least one of the conductor tracks is not connected to the on-board electronics system.

14. The motor vehicle as claimed in claim 4, wherein the conductor tracks define a plug-in opening at an end region thereof and extending therethrough, the plug-in opening sized to receive and connect to one of the electrical components.

15. A method to produce a housing to accommodate electrical components of a motor vehicle, comprising:
    providing a first housing part and a second housing part by injection molding to define a cavity between the first and second housing parts, the first housing part provided with a first central region with a contact area to bear the housing against a windshield, the first housing part provided with a first edge region peripherally extending about the first central region, the second housing part provided with a second central region and a second edge region extending peripherally about the second central region, wherein the electrical components are arranged in the cavity;
    connecting the first edge region of the first housing part to the second edge region of the second housing part to assemble the housing and form the cavity between the first and second central regions; and
    encapsulating conductor tracks during the injection-molding operation to conductively connect the electrical components to a control unit of an on-board electronics system, the first and the second central regions of the first and second housing parts are each provided with the conductor tracks to which the electrical components are arranged in the cavity and conductively connected.

16. The method as claimed in claim 15 further comprising interchanging signals between the electrical components and the control unit to control the electrical components.

17. The method as claimed in claim 15, wherein the electrical components include an electronic interior rearview mirror, a light sensor, a rain sensor, a moisture sensor, a camera, a charger or a heating apparatus.

* * * * *